(12) United States Patent
Sinha et al.

(10) Patent No.: US 8,845,812 B2
(45) Date of Patent: Sep. 30, 2014

(54) METHOD FOR CONTAMINATION REMOVAL USING MAGNETIC PARTICLES

(75) Inventors: Nishant Sinha, Boise, ID (US); Steve Kramer, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1090 days.

(21) Appl. No.: 12/483,518

(22) Filed: Jun. 12, 2009

(65) Prior Publication Data

US 2010/0313907 A1 Dec. 16, 2010

(51) Int. Cl.
*B08B 7/00* (2006.01)

(52) U.S. Cl.
USPC ..................... 134/1.3; 134/1; 134/6

(58) Field of Classification Search
CPC .......................................................... B08B 7/00
USPC ...................................................... 134/1, 1.3
See application file for complete search history.

(56) References Cited

U.S. PATENT DOCUMENTS

| | | | |
|---|---|---|---|
| 3,695,934 A * | 10/1972 | Feldhaus | 134/1 |
| 5,091,206 A * | 2/1992 | Wang et al. | 427/2.18 |
| 5,382,373 A | 1/1995 | Carlson et al. | |
| 6,133,047 A | 10/2000 | Elaissari et al. | |
| 6,291,249 B1 | 9/2001 | Mahant et al. | |
| 6,503,761 B1 * | 1/2003 | Koenig et al. | 436/526 |
| 6,514,416 B1 | 2/2003 | Harradine et al. | |
| 6,562,239 B2 | 5/2003 | Foy et al. | |
| 6,572,778 B2 | 6/2003 | Sterman et al. | |
| 6,623,984 B1 | 9/2003 | Fleischman et al. | |
| 6,682,660 B2 | 1/2004 | Sucholeiki et al. | |
| 6,689,615 B1 | 2/2004 | Murto et al. | |
| 6,776,171 B2 | 8/2004 | Carpenter et al. | |
| 6,783,599 B2 | 8/2004 | Gale et al. | |
| 6,797,071 B2 | 9/2004 | Kittle | |
| 6,799,583 B2 | 10/2004 | Puri et al. | |
| 6,892,738 B2 | 5/2005 | Bran et al. | |
| 6,958,372 B2 | 10/2005 | Parker et al. | |
| 7,093,375 B2 | 8/2006 | O'Donnell | |
| 7,160,735 B2 | 1/2007 | Dehlinger et al. | |
| 7,163,018 B2 | 1/2007 | Verhaverbeke et al. | |
| 7,186,398 B2 | 3/2007 | Andres et al. | |
| 7,189,359 B2 | 3/2007 | Yuan et al. | |

(Continued)

FOREIGN PATENT DOCUMENTS

| | | |
|---|---|---|
| JP | 2007157930 A | 6/2007 |
| JP | 2007158161 A | 6/2007 |

(Continued)

OTHER PUBLICATIONS

Leun et al., "Preparation and Characterization of Magnetically Active Polymeric Particles (MAPPs) for Complex Environmental Separations", Environ. Sci. Technol., vol. 34, No. 15 (2000), pp. 3276-3282.*

(Continued)

*Primary Examiner* — Michael Kornakov
*Assistant Examiner* — Douglas Lee
(74) *Attorney, Agent, or Firm* — TraskBritt (57) ABSTRACT

Methods and apparatus are provided for cleaning a substrate (e.g., wafer) in the fabrication of semiconductor devices utilizing a composition of magnetic particles dispersed within a base fluid to remove contaminants from a surface of the substrate.

38 Claims, 4 Drawing Sheets

(56) References Cited

U.S. PATENT DOCUMENTS

| | | |
|---|---|---|
| 7,214,427 B2 | 5/2007 | Huang et al. |
| 7,258,799 B2 | 8/2007 | Ras et al. |
| 7,273,060 B2 | 9/2007 | Patel et al. |
| 7,306,083 B2 | 12/2007 | Ulicny et al. |
| 2002/0040724 A1 | 4/2002 | Gotkis |
| 2004/0089322 A1* | 5/2004 | Shinozaki et al. ............ 134/7 |
| 2004/0261823 A1 | 12/2004 | de Larios |
| 2005/0118810 A1 | 6/2005 | Harada et al. |
| 2005/0133061 A1 | 6/2005 | de Larios et al. |
| 2005/0158671 A1 | 7/2005 | Shimizu et al. |
| 2005/0217703 A1 | 10/2005 | O'Donnell |
| 2006/0035797 A1 | 2/2006 | Tomita et al. |
| 2006/0128590 A1 | 6/2006 | Freer et al. |
| 2006/0128600 A1 | 6/2006 | Freer et al. |
| 2006/0254078 A1 | 11/2006 | O'Donnell |
| 2006/0283486 A1 | 12/2006 | de Larios et al. |
| 2006/0285930 A1 | 12/2006 | de Larios et al. |
| 2007/0000518 A1 | 1/2007 | Korolik et al. |
| 2007/0023247 A1 | 2/2007 | Ulicny et al. |
| 2007/0034229 A1 | 2/2007 | Okuuchi et al. |
| 2007/0107756 A1 | 5/2007 | Woods et al. |
| 2007/0119477 A1 | 5/2007 | Redecker et al. |
| 2007/0125400 A1 | 6/2007 | Matsui |
| 2007/0163619 A1 | 7/2007 | Idani |
| 2007/0181148 A1 | 8/2007 | Yun et al. |
| 2007/0240737 A1 | 10/2007 | Zhu et al. |

FOREIGN PATENT DOCUMENTS

| | | |
|---|---|---|
| KR | 100766460 B1 | 10/2007 |
| TW | 270920 B | 1/2007 |
| TW | 270921 B | 1/2007 |
| WO | 0059006 A1 | 10/2000 |
| WO | 2006062923 A2 | 6/2006 |
| WO | 2007085022 A2 | 7/2007 |
| WO | 2007107920 A1 | 9/2007 |

OTHER PUBLICATIONS

Bangs Laboratories, Inc., TechNote 102, Rev. 005, Jan. 6, 2004, pp. 1-4.

R. Kumar et al., Journal of Applied Physics, vol. 89, No. 11, Jun. 1, 2001, pp. 6324-6328.

C. Ahn, et al., Journal of Microelectromechanical Systems, vol. 5, No. 3, Sep. 1996, pp. 151-158.

T. Geldhauser, et al., Appl. Phys. A 89, 109-113 (2007).

S. Chen, et al., Proceedings of 13th IPFA 2006, Singapore, pp. 137-140.

S.A. Chambers, Final Report, U.S. Department of Energy, Molecular-Level Processes Governing the Interaction of Contaminants with Iron and Manganese Oxides, Oct. 1, 1996 to Oct. 1, 1999, pp. 1-38.

Nanotechnology based magnetic separation could revolutionize separation technology, http://www.nanowerk.com/spotlight/spotid=2632.php, posted: Sep. 19, 2007.

Polysciences, Inc., Technical Data Sheet 571, May 26, 2006.

Bangs Laboratories, Inc., BioMag Product Descriptions, http://www.bangslabs.com/products/bangs/biomag_products.php, printed Apr. 18, 2008.

Bangs Laboratories, Inc., Selection Guide, http://ww.bangslabs.com/products/bangs/guide.php, printed Dec. 21, 2007.

Bangs Laboratories, Inc., Product Data Sheet 575, Oct. 2, 2007.

Bangs Laboratories, Inc., Product Data Sheet 576, Oct. 2, 2007.

Bangs Laboratories, Inc., Product Data Sheet 700, Sep. 12, 2007.

Bangs Laboratories, Inc., Product Data Sheet 703, Oct. 2, 2007.

Bangs Laboratories, Inc., Product Data Sheet 705, Sep. 13, 2007.

Bangs Laboratories, Inc., Product Data Sheet 715, Apr. 2, 2007.

Bangs Laboratories, Inc., Product Selection Guide Search Results, http://www.bangslabs.com/scripts/PSGFind.pl?return=7.1&code=UMC, printed May 31, 2007.

Bangs Laboratories, Inc., Product Selection Guide Search Results, http://www.bangslabs.com/scripts/PSGFind.pl?return=72&code=MC, printed May 31, 2007.

Bangs Laboratories, Inc., Product Selection Guide Search Results, http://www.bangslabs.com/scripts/PSGFind.pl?return=7.3&code=ME, printed May 31, 2007.

Bangs Laboratories, Inc., Product Selection Guide Search Results, http://www.bangslabs.com/cgi-bin/PSGFind.pl?return=72&code=MC, Apr. 18, 2008.

Mangeney, C., Langmuir, 23 (22): 10940-9, Sep. 28, 2007, Abstract only.

* cited by examiner

METHOD FOR CONTAMINATION REMOVAL USING MAGNETIC PARTICLES

TECHNICAL FIELD

Embodiments of the invention relate to methods and apparatuses for cleaning surfaces of a substrate.

BACKGROUND OF THE INVENTION

A common occurrence during semiconductor device fabrication is the accumulation of particulate contaminants on semiconductor device surfaces. Various processes and cleaning solutions have been used for the removal of small residual particles and other contaminants from surfaces, such as a wafer surface in the fabrication of semiconductor-based structures and devices. A post-process clean is typically conducted to remove contaminants remaining on a surface after a processing step such as etching, planarization, polishing, sawing, film deposition, etc., prior to performing another device fabrication step such as a metallization, gate or device formation, etc. If residues or contaminants remaining from a process step are not effectively removed, various fabrication problems and defects in the finished integrated circuit device can result. For example, metal contaminants that remain on a surface feature can cause shorts between capacitor electrodes or other electrical failures, and non-conductive contaminants on a feature such as particles (e.g., $SiO_2$, polysilicon, nitride, polymers, etc.) remaining after a chemical-mechanical planarization or polishing (CMP) or other process can cause the failure in adhesion of subsequent layers, a loss of critical dimension of the formed feature, or pattern deformation in that area leading to yield loss. Current technology nodes (e.g., 65 nm and smaller) require a high level of surface cleaning, including the removal of remnant particles, residues and other contaminants while maintaining other surface materials intact.

One example of a known cleaning technique used to remove unwanted surface materials is an RCA clean, which conventionally includes first applying an aqueous alkaline cleaning solution known as a Standard Clean 1 (SC1) to remove particle contaminants. SC1 typically consists of a dilution of ammonium hydroxide/hydrogen peroxide ($NH_4OH/H_2O_2$) followed by a deionized (DI) water rinse. An example of a cleaning technique to remove metal contaminants is an aqueous acidic cleaning solution known as a Standard Clean 2 (SC2) composed of a hydrochloric acid/hydrogen peroxide ($HCl/H_2O_2$) dilution followed by a second DI water rinse. Other wet cleaning methods used for cleaning residues from structures include, for example, a piranha clean using a sulfuric acid-based mixture (e.g., $H_2SO_4/H_2O_2$), a buffered oxide etch solution, and fluorine-based aqueous chemistries.

Small particles or other contaminants resulting from fabrication steps can be held to a surface by electrostatic and/or other forces and can become adhered, typically requiring relatively large forces to remove them. Cleaning solutions are often applied in conjunction with acoustic energy (i.e., ultrasonic or megasonic energy), high pressure spraying techniques, mechanical scrubbing techniques with a pad or brush, etc., to enhance the cleaning action of the solution. However, acoustic cleaning and spraying techniques apply cleaning forces in a manner that is difficult to control, which can cause damage to surface structures or alter critical dimensions without effectively removing all of the particulate contaminants from the substrate. In addition, many cleaning solutions can attack and/or dissolve the structures formed in the fabrication step.

Other techniques involve forcing solid particles (e.g., salts of fatty acid solids, paraffin, wax, polymers, etc.) dispersed within a continuous phase to a substrate surface to disengage surface contaminants, which can damage to line elements and other surface structures. For example, some techniques apply a chemical or foam that contains salts of fatty acid solids (e.g., crystals of stearic acid salts) by dispensing from a rotary head or proximity cleaning head. However, stearic acid crystal size and its velocity in a dynamic foam are difficult to control, resulting in damage to surface structures (e.g., line elements) by poorly controlled parameters within the foam.

It would be desirable to provide a process for removing contaminants from a surface without adversely affecting structures and/or surface materials on a substrate that overcomes these problems.

BRIEF DESCRIPTION OF THE DRAWINGS

Embodiments of the present disclosure are described below with reference to the following accompanying drawings, which are for illustrative purposes only. Throughout the following figures, reference numerals will be used in the drawings, and the same reference numerals will be used throughout the several figures and in the description to indicate same or like parts.

FIG. 2A is a top plan view of the apparatus of FIG. 2, taken along line 2A-2A.

DETAILED DESCRIPTION

The following description, with reference to the drawings, provides illustrative examples of apparatus and methods according to embodiments of the present disclosure. Such description is for illustrative purposes only and not for purposes of limiting the same.

The terms "wafer" and "substrate" are interchangeable and are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures.

Furthermore, when reference is made to a "wafer" and/or "substrate" in the following description, previous process steps may have been utilized to form regions or junctions in or over the base semiconductor structure or foundation. Additionally, when reference is made to a "substrate assembly" in the following description, the substrate assembly may include a wafer with materials including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others.

In embodiments of the invention, the composition is a fluid suspension composed of magnetic particles dispersed in a carrier or base fluid that is chemically compatible with the materials to be treated. In embodiments, the carrier fluid is a continuous phase selected so as not to damage or adversely affect surface materials and/or structures situated on a substrate, with suitable chemical and thermal stability over the temperature range of the application. The carrier fluid should have a wide temperature range with a low freezing point and a high boiling point (e.g., from about −40° C. to about +200° C.). The pH of the composition can be from about 1 to about 13, or any value or sub-range therebetween.

The carrier fluid can be an aqueous solution, for example, water or a buffer such as saline, phosphate, borate, acetate, citrate, carbonate, bicarbonate or other buffer, with a pH of about 3-11, or a value or sub-range therebetween. In other embodiments, the carrier fluid can be water with appropriate surfactants to stabilize the magnetic particles in suspension.

In other embodiments, the carrier fluid can be a non-aqueous liquid, including, for example, silicone oils such as polyalkyl-, polyaryl-, polyalkoxy-, or polyaryloxysiloxane oils and silicate oils (e.g., polydimethyl siloxanes, liquid methyl phenyl siloxanes, tetraethyl silicate, etc.); mineral oils; vegetable oils (e.g., sunflower oils, rapeseed oil, soybean oil, etc.); hydrocarbon oils including paraffin oils, naphthalenes, chlorinated paraffins, olefin oligomers and hydrogenated olefin oligomers (e.g., polyisobutylene, ethylene-propylene copolymers, etc.); polyphenylethers; polyesters (e.g., perfluorinated polyesters, etc.); dibasic acid esters; neopentylpolyol esters; phosphate esters; glycol esters and ethers (e.g., polyalkylene glycol, etc.); aromatic-type oils (e.g., benzoic acid, phthalic acid, etc.); alkylene oxide polymers and interpolymers, and derivatives thereof (e.g., methylpolyisopropylene glycol, etc.); carbon tetrachloride; fluorocarbons; chlorofluorocarbons; ketones; and alcohols, among others.

The carrier fluid should have a viscosity that permits movement of the magnetic particles within the suspension when applied to a substrate in the presence of a magnetic field. The viscosity of the carrier fluid can be varied according to the type and concentration of the magnetic particles from a relatively low viscosity carrier fluid, such as isopropyl alcohol (IPA), acetone and propanol, to a relatively high viscosity carrier fluid, such as an ethylene glycol/sulfuric acid mixture. The viscosity of the carrier fluid can be determined according to known techniques, for example, using a viscometer.

The magnetic particles are typically composed of a ferromagnetic, ferrimagnetic, paramagnetic, or superparamagnetic material combined with and/or coated with a material that is functionalized to have surface functional reactive groups to bind with or repel contaminants on the surface of a substrate. The composition of the magnetic particles determines characteristics including hydrophobicity/hydrophilicity and charge (positive/negative), which can affect coupling to or repulsion of contaminants.

Methods for producing magnetic particles are known in the art, as described, for example, in U.S. Pat. No. 5,091,206 to Wang et al. (assigned to Baxter Diagnostics Inc.), U.S. Pat. No. 6,133,047 to Elaissari et al. (assigned to Bio Merieux), U.S. Pat. No. 6,682,660 to Sucholeiki et al. (assigned to MDS Proteomics, Inc.), U.S. Pat. No. 7,186,398 to Andres et al. (assigned to Purdue Research Foundation), and U.S. Pat. No. 7,214,427 to Huang et al. (assigned to Aviva Biosciences Corporation).

In embodiments of the invention, the magnetic particles can be composed of a magnetic material dispersed in a polymer matrix that includes ligands or reactive functional groups presented on the surface of the magnetic particle such that binding moieties are available for interaction with a target contaminate(s). In other embodiments, the magnetic material can be combined with a polymeric material, ceramic material, semiconductive material, etc., to form a core particle and then surface coated with a polymeric material that provides surface reactive functional groups.

In another embodiment, a magnetic material (e.g., metal oxide) can be mixed with monomer(s) and coated onto a polymeric core particle (e.g., polystyrene particles), ceramic material core particle, semiconductive material core particle, etc., which can be coated with a layer of functionalized polymer to provide functional groups such as carboxyl, amino or hydroxyl groups for covalent coupling of contaminant materials. Magnetic particles (or core particles) can be overcoated with the same or a different polymer than used for forming a polymer/magnetic material core particle. In yet other embodiments, a magnetic material (e.g., a metal oxide) can be formed as a core particle and coated with a polymeric material that provides surface reactive functional groups.

Non-limiting examples of magnetic materials that can be utilized include iron, iron oxides, iron nitrides, iron carbides, silanized iron oxides, carbonyl iron, chromium dioxide, low carbon steel, silicon steel, nickel, cobalt, etc., or combinations or alloys of such materials, for example, Fe—Co compounds and alloys (e.g., CoFe), Fe—Ni compounds and alloys (e.g., $Ni_3Fe$), Mn—Zn ferrite, Ni—Zn ferrite, AlNiCo alloys, and ceramic ferrites such as magnetite ($Fe_3O_4$), maghemite ($Fe_2O_3$) magnesioferrite ($MgFe^{3+}{}_2O_4$), jacobsite ($MnFe_2O_4$), trevorite ($NiFe^{3+}{}_2O_4$), pyrrohite ($Fe_{(1-x)}S$ (x=0 to 0.2)), greigite ($Fe(II)Fe(III)_2S_4$), and rare earth magnets such as neodymium magnet (NdFeB magnet or Neo magnet) and samarium cobalt magnet alloys (generally $SmCo_5$), etc., among others.

The reactive functional groups can be incorporated onto the surface of the magnetic particles, for example, by using a functionalized monomer or a mixture of monomers and functionalized monomers with a magnetic material during formation of magnetic particles composed of a polymeric and magnetic material. In other embodiments, a magnetic material or a polymer/magnetic material core particle can be coated with a thin layer of functionalized monomer (or monomer/functionalized monomer mixture) to form a polymeric outer layer. Inclusion of an effective amount or percentage of functionalized monomers can eliminate adding materials having functionalized groups after formation of the particles.

Polymeric materials can be produced using monomers having reactive functional groups including, for example, groups containing C—O bonds, such as carboxyl groups, aldehyde groups, carbonyl (ketone) groups, ether groups, ester groups, peroxy groups, etc.; hydroxyl functional groups; hydrazide functional groups; hydrocarbon functional groups, such as alkyl (methyl) groups, alkenyl (alkene) groups, alkynyl (alkyne) groups, vinyl groups, phenyl groups, benzyl groups, etc.; nitrogen-containing functional groups, such as amide groups, amine (amino) groups, imine groups, azo groups, nitrile (cyano) groups, nitro groups, nitroso groups, pyridyl groups, isocyanate groups, isothiocyanate groups, etc.; functional groups containing a carbon-halogen bond, such as halide groups, fluoro groups, chloro groups (e.g., chloromethyl groups), etc.; sulfur-containing functional groups, such as sulfate groups, etc.; and groups containing phosphorus and sulfur, such as phosphodiester groups, sulfhydryl (thiol) groups, phosphorus sulfide groups, etc.; and combinations thereof.

The polymeric material can be produced by conventional methods including emulsion polymerization, suspension polymerization or other polymerization process, with or without the use of a cross-linking agent (e.g., divinyl benzene, etc.). Monomers that can be utilized to produce the polymeric material include vinyl monomers such as styrene, vinyl toluene, and substituted styrenes (e.g., chloromethyl styrene), acrylates and methacrylates (e.g., methylmethacrylate, 2-hydroxyethyl methacrylate, 2-aminoethyl methacrylate, etc.), among others, including copolymers and multiblock copolymers (e.g., styrene-divinylbenzene copolymer, styrene/butadiene copolymer, styrene/vinyltoluene copolymer, etc.).

In other embodiments, a ligand having a reactive functional group can be attached to the surface of the magnetic particles, for example, through covalent attachment, non-covalent binding, chemical coupling, or adsorption by hydrophobic (van der Waals) attraction, hydrophilic attraction or ionic interaction, according to conventional methods for surface functionalization. Metal and ceramic material can generally be functionalized through covalent bonds such as a metal-oxygen bond, a metal-sulfur bond, or a metal-carbonyl bond according to conventional methods. Ligands can also be attached to metal surfaces electrostatically. See for example, Baraton, Marie-Isabelle (ed.), Synthesis, *Functionalization and Surface Treatment of Nanoparticles*, American Scientific Publishers, Valencia, Calif., 323 pp. (2003), and Sigma-Aldrich, Inc., *Surface Functionalized Nanoparticles* at www.sigmaaldrich.com/materials-science/material-science-products.html?TablePage=16377718.

Ligands can be attached to the magnetic particles, for example, using an absorption buffer (e.g., phosphate buffered saline (PBS), borate buffer, acetate buffer, citrate phosphate buffer, carbonate-bicarbonate buffer, MES buffer, etc.). Optionally, a blocker can be adsorbed onto the magnetic particles to reduce non-specific binding between the magnetic particle and non-target molecules and self-aggregation of the magnetic or core particles (e.g., BSA, non-ionic surfactants such as TWEEN® 20 and TRITON® X-100, polyethylene glycol, etc.). In some embodiments, a linker molecule (e.g., a cleavable linker) that includes difunctional groups can be used to covalently couple a ligand having a reactive functional group to a magnetic material, and/or to a polymer magnetic material core particle, etc. A linker (e.g., BSA, polylysine, or molecule having an alkane, alkene, ester, ether or other group, etc.) can also function as a spacer to extend a small molecule with a reactive functional group from the magnetic particle and reduce steric hindrance.

In other embodiments of the invention, the magnetic particles can be formed without ligands or reactive functional groups. An additive material bearing a ligand having a reactive functional group (e.g., a functionalized monomer, monomer/functionalized monomer mixture, etc.) can be added to the carrier fluid with the non-functionalized magnetic particles, wherein the additive material will react, for example, to covalently couple the magnetic particles with the contaminants. For example, the magnetic particles can be composed of a magnetic material with a core of a polymeric material, a ceramic material, a semiconductive material, etc. In other embodiments, the magnetic particles are composed of a magnetic material combined with a polymeric material, a ceramic material, a semiconductive material, etc., to form a composite particle. In other embodiments, the magnetic particles are composed of a core of a magnetic material overcoated with a polymeric material, a ceramic material, a semiconductive material, etc.

Magnetic particles can be prepared, for example, from an aqueous suspension of a magnetic material and monomer(s), with or without a cross-linking agent such as divinylbenzene (e.g., ferrofluid (magnetite)/styrene/divinylbenzene) that is polymerized to trap the magnetic materials (e.g., magnetite) in a polymer matrix to form a core particle. The core particle can be encapsulated by a polymer material with reactive functional groups, for example, carboxyl (—COOH) or amine groups that are available on the surface of the magnetic particle to react with contaminants on the substrate. Such magnetic particles are commercially available, for example, as COMPEL™ superparamagnetic particles, composed of a magnetite/polymer matrix coated with a polymer with carboxyl (—COOH) surface groups (mean diameter of about 3-8 µm; density of about 1.1-1.2 g/cm$^3$) available from Bangs Laboratories, Inc., (Fishers, Ind., USA).

The size and shape(s) of the magnetic particles can be varied according to the contaminant to be removed and for effective substrate cleaning without damaging the substrate or the structures and materials on the substrate. In embodiments of the invention, the magnetic particles can have an average particle size (particle diameter) of about 1-100 times the size of the contaminant to be removed, for example, about 0.01-100 µm (as measured by transmission electron microscopy (TEM)), or any value or sub-range therebetween, e.g., about 0.1-40 µM, about 1-10 µm, etc. The shape of the magnetic particles can be regular or irregular, spherical or non-spherical, and can be in the form of a powder, fibers, spheres, rods, plates, core-shell structures, and the like, including, nano-sized rods (e.g., 10 nm to 100 nm) and microspheres.

The volume fraction (concentration) of magnetic particles in the composition should be sufficient to provide the desired effect or performance. The concentration of magnetic particles is such that the particles can be maintained as a dispersion in the base fluid without settling, and to allow the composition to maintain a relatively low viscosity for application onto the substrate. Generally, the concentration of magnetic particles in the base fluid can be in a range of about 0.1-30% by weight of the total composition, or any value or sub-range therebetween, and in some embodiments at about 20-30% by weight, about 10-30% by weight, about 1-10% by weight, etc. The weight percentage of the magnetic particles can be adjusted according to the density of the fluid phase and/or the amount of contaminants to be removed. In other embodiments, the density of the particles can be matched with a base fluid for dispersion of the magnetic particles within the composition. The magnetic particle loading in the dispersion can be varied according to the desired weight % or according to the dispersion of the magnetic particles in the fluid carrier (loading before flocculation), which is dependent, at least in part, on particle surface chemistry, the fluid carrier or dispersion medium, particle size, and/or additives.

Optionally, the composition can contain typically used additives, generally at about 0.1-10% by weight of the total composition, or about 0.5-6% by weight. Typical additives include, for example, co-solvents, pH modifiers, chelating agents, antioxidants, rheology modifiers (e.g., polymers, particulates, polypeptides, etc.), polar solvents, and surfactants or dispersing agents (dispersants) to enhance the dispersion stability of the suspension against sedimentation and aggregation or agglomeration of the magnetic particles. Examples of surfactants include block copolymers, dedecyl alcohol, fatty acids and amines, glycerol, glycerol esters, glycerol monooleates, hydrocarbon polymers, sodium oleate, and tin oxide, among others. The composition can also include a chemical compound to modify or bind to the available reactive group on the magnetic particle, for example, a cross-linking agent to activate groups having a low reactivity to the contaminant (e.g., carbodiimide for binding to COOH groups) or to join non-reactive groups. The composition should not contain compounds or additives that will interfere with or compete with the binding reaction of the magnetic particles with contaminants.

In some embodiments, an additive material bearing a ligand having a reactive functional group (e.g., a functionalized monomer, monomer/functionalized monomer mixture, etc.) that is not bound to the magnetic particles can be added to the carrier fluid with magnetic particles that have not been functionalized and/or with functionalized magnetic particles.

An embodiment of a method according to the invention for removing contaminants from a substrate to be processed is described with reference to FIGS. 1-2A.

Figure 1:
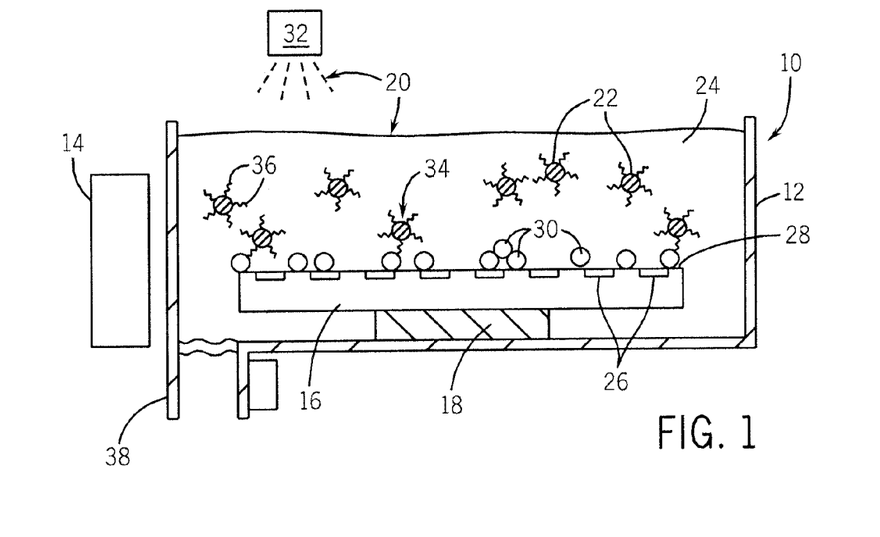
FIG. 1 is a diagrammatic elevational cross-sectional view of an apparatus for removing contaminants from a substrate according to an embodiment of the invention.

FIG. 1 depicts an embodiment of an apparatus, designated generally as 10, which can be utilized in methods of the invention. The apparatus 10 generally includes a containment vessel (or container) 12 for receiving and containing a fluid, and a magnetic field generator 14. As shown, a substrate 16 to be treated, which is a wafer in the present example, can be placed onto a substrate support 18 within the containment vessel 12. The containment vessel 12 can be composed of an insulating material such as glass, plastic, polyvinylidene fluoride (PVDF), etc The apparatus 10 can be connected to other processing units/systems, for example, by a conveyor mechanism (not shown) for conducting the substrate 16 through a processing system, including a pre-cleaning apparatus and/or a post-cleaning apparatus (not shown). The various processing units can be electrically coupled to a microprocessor, which may be programmed to carry out particular functions as is known in the art. A pre-cleaning apparatus can be designed to physically loosen up particles from the substrate 16 by means of undercutting or etching of the substrate 16, which can be performed, for example, by a Standard Clean 1 (SC1) clean or dilute hydrofluoric acid (DHF) clean, followed by a rinse (e.g., DI rinse). This can serve to reduce the treatment required for removal of contaminants. A post-cleaning can be applied to remove remaining particles.

As depicted in FIG. 1, the substrate 16 to be treated is contacted by a composition 20, according to the invention, composed of magnetic particles 22 in a base fluid 24. The substrate 16 can comprise structures 26 such as conductive or insulative lines, shallow trench isolation (STI) structures, bond pads, contacts and interconnects, among other elements, exposed at a surface 28 of the substrate 16. Contaminants 30 composed of conductive, insulative and/or semiconductive materials such as oxides, nitrides, silicon materials, carbon, polymer resist, metals and metal-containing materials (e.g., W, $WSi_x$, TiN, $Ta_2O_5$, etc.), among others, can remain adhered to the structures 26 and/or the surface 28 of the substrate 16 as a result of earlier processing (e.g., an SC1 clean, etc.).

The composition 20 can be applied to the substrate 16, for example, from a dispensing device 32. In some embodiments, the dispensing device 32 can be structured to deliver the composition 20 under pressure onto the surface 28 of the substrate 16. In other embodiments, the containment vessel 12 can include an inlet and an outlet for passage of the composition 20 into and out of the vessel 12.

In embodiments of the invention, the magnetic particles 22 are allowed to react with contaminants 30 for a time and at a temperature to permit substantial interaction to form contaminant-conjugated magnetic particles 34. Optionally, the composition 20 can be mixed (continuously or intermittently) during the reaction period. Reaction time can vary, for example, according to the nature and concentration of contaminants 30, the mechanism by which binding occurs, and the affinities of the reactive functional groups 36 that are used.

Reactive functional group(s) 36 on the surface of the magnetic particles 22 can chemically and/or physically interact with one or more contaminants 30, for example, by adsorption, covalent bonding, or a non-covalent interaction (e.g., hydrogen bond, ionic bond, van der Waals forces, etc.) to form contaminant-conjugated magnetic particles 34. In some embodiments, the reactive functional group(s) 36 on surfaces of the magnetic particles can provide a repelling force to cause contaminants 30 to be displaced and/or separated from the surface 28 of the substrate 16 and structures 26. The magnetic particles 22 are structured with reactive functional groups 36 that will provide an interaction with contaminants 30 that is stronger than the interactive force of the surface 28 of the substrate 16 or structures 26 with the target contaminant. The chemical composition of the contaminants 30 and the surface 28 of the substrate 16 and structures 26 will determine, at least in part, the ultimate strength of adhesion of contaminants 30 to the substrate 16 and surface structures. The interaction of magnetic particles 22 with contaminants 30 can be enhanced, for example, by the inclusion of a surfactant or dispersing agent to maintain the magnetic particles as a dispersion in the composition 20, by adjusting the pH, by application of the magnetic field, and/or by the inclusion of a chemical agent to enhance reactivity of the surface functional groups.

Figure 2:
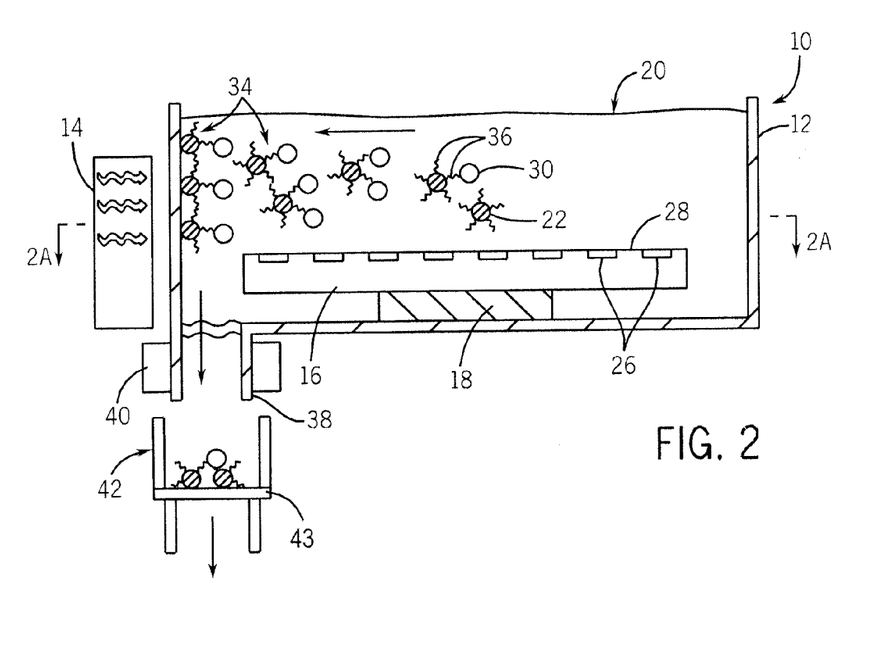
FIG. 2 is a cross-sectional view of the apparatus shown in FIG. 1 at a subsequent processing stage showing the application of a magnetic field.

Referring to FIGS. 2 and 2-A, a magnetic field (arrows is applied to attract (or repel) contaminant-conjugated magnetic particles 34 (and non-conjugated, magnetic particles 22) at a low force to draw and disengage the contaminants 30 from the surface 28 of the substrate 16 and structures 26. The interaction of the magnetic particles 22 with the contaminants 30 and movement of magnetic particles 22 in response to the magnetic field(s) provides removal of contaminants 30 without damage to the device structures (e.g., lines, etc.) on the surface 28 of the substrate 16. Devices for magnetic separation of particles in solution are generally described, for example, in U.S. Pat. No. 6,562,239 (Foy et al.), U.S. Pat. No. 6,572,778 (Sterman et al.), U.S. Pat. No. 6,689,615 (Murto et al.), U.S. Pat. No. 7,258,799 (Ras et al.), and Bangs Laboratories, Inc., TechNote 102, Rev. 005, Jan. 6, 2004 (at www.bangslabs.com).

In any of the described embodiments, the magnetic field generator 14 can be a permanent magnet, electromagnet (connected to a power source) or superconducting magnet, and can be composed, for example, of ferromagnetic or rare earth magnets. An insulator (not shown) can be positioned between the magnetic field generator 14 and the containment vessel 12 or the substrate 16 to block or shield the substrate from a magnetic field. In some embodiments, the magnetic field generator can be incorporated into a containment vessel, e.g., embedded in a sidewall of the vessel.

In the embodiment illustrated in FIGS. 1-2A, a magnetic field generator 14 is positioned along one side of the containment vessel 12 such that a magnetic field is applied in a single direction relative to the substrate 16. When the composition 20 is exposed to a sufficiently high magnetic field from the magnetic field generator 14, the magnetic particles (both unbound, non-conjugated magnetic particles 22 and conjugated magnetic particles 34) will move in response to the magnetic field that is generated, i.e., attracted toward the magnetic field (arrows ←) as shown in FIG. 2, or repulsed away. The velocity at which the contaminant-conjugated magnetic particles 34 are moved can be varied, for example, by adjusting the strength of the magnetic field and/or the position of the magnetic field generator 14 with respect to the substrate 16.

Figure 3:
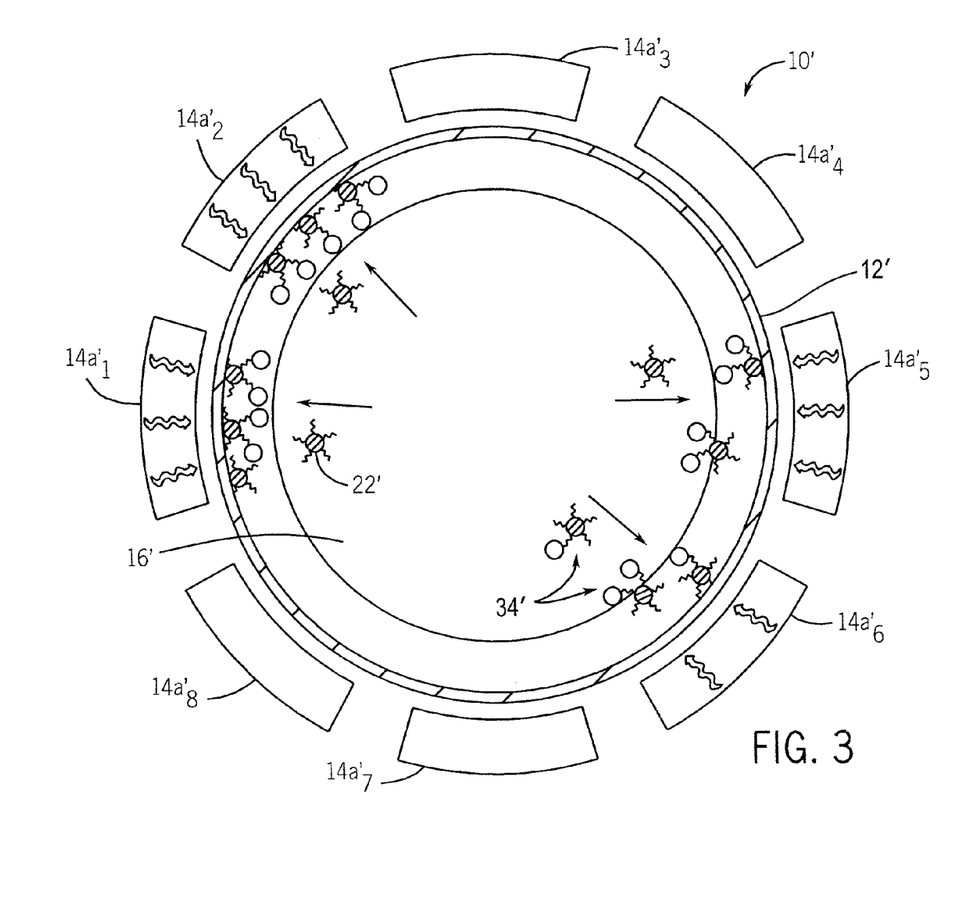
FIG. 3 is a diagrammatic top plan view of an apparatus for removing contaminants from a substrate according to another embodiment of the invention, showing multiple magnetic field generators positioned about a containment vessel.
Figure 4:
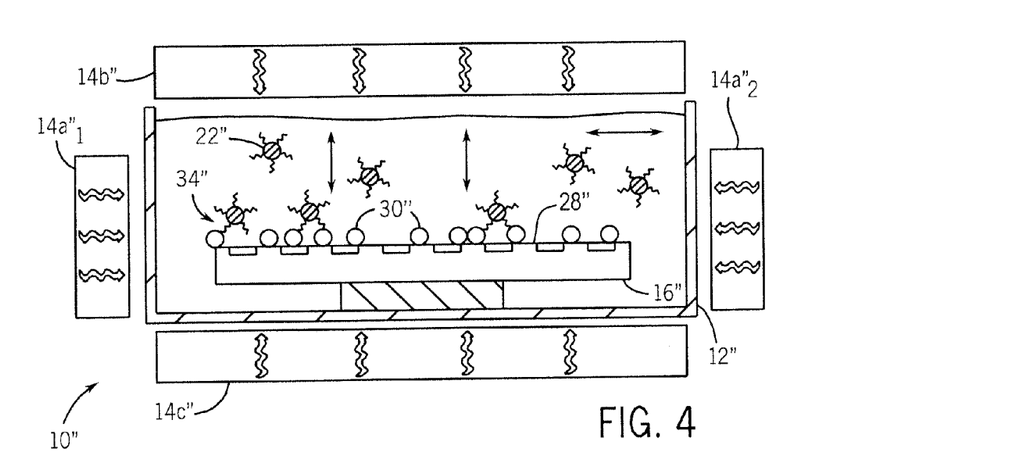
FIG. 4 is a diagrammatic elevational cross-sectional view of an apparatus for removing contaminants from a substrate according to another embodiment of the invention, showing magnetic field generators situated at each side, above and/or below a containment vessel.

The magnetic field generator 14 can be positioned relative to the substrate 16 to apply a magnetic field to draw magnetic particles 22 in a lateral direction (arrows ←↓) across the substrate 16. For example, a magnetic field generator can be situated at one location as depicted in FIG. 2A, or one or more magnetic field generators can surround a substrate (partially or completely) as illustrated in FIGS. 3 and 4. In embodiments of the invention, a plurality of magnetic field generators (e.g., $14a_1'$ to $14a_8'$ in FIG. 3; $14a_1''$, $14a_2''$ in FIG. 4) can be positioned around the substrate at multiple locations to apply a magnetic field in more than one direction relative to the substrate. As further illustrated in FIG. 4, in some embodiments, a magnetic field generator can be situated above (as shown by magnetic field generator $14b''$) and/or below (as shown by magnetic field generator $14c''$) the substrate 16" to draw magnetic particles in an upward (↑) or a downward (↓) direction relative to the substrate 16.

Multiple magnetic field generators can be independently controlled, for example, using a dedicated power supply in the case of electromagnets, by the positioning of an insulator to shield one or more of the magnetic field generators from the substrate, or by using a field generator control by connecting the magnetic field generator(s) in communication with a controller comprising a computer device configured under control of a program to control the magnetic field, e.g., when the magnets are turned off and on.

In embodiments of the invention, a magnetic field can be applied in a single direction relative to the substrate to draw (or repel) the magnetic particles including the contaminant-conjugated magnetic particles, laterally in a single direction, which can reduce damage to the substrate and/or structures on the substrate.

In other embodiments, a magnetic field can be applied in multiple directions to enhance contact and interaction of magnetic particles with contaminants and the removal of contaminants from the substrate. Two or more magnetic field generators can be activated simultaneously, in succession, in an alternating sequence, in pairs, or in other combinations or sequences. For example, referring to FIG. 3, magnetic field generators $14a_1'$, $14a_2'$ and $14a_5'$, $14a_6'$ on opposing sides of a substrate 16' can be activated to generate magnetic fields (arrows ≈>) to attract and draw magnetic particles 22' in a lateral direction (arrows ←↓) to opposite sides of the substrate 16' and containment vessel 12'.

In some embodiments, a magnetic field can be applied in a first direction and then in a second direction. In yet other embodiments of the invention, the magnetic field can be oscillated, for example, by pulsing the magnetic field(s), by cyclically or repeatedly applying and terminating the magnetic field(s) and/or by increasing and decreasing the strength of the magnetic field(s), which can cause the magnetic particles and contaminant-conjugated magnetic particles to move (e.g., rock or oscillate) with a low force to enhance the interaction of magnetic particles with contaminants.

In yet other embodiments, the magnetic field generator(s) can be movable to vary its position relative to the substrate. For example, a magnetic field generator $14c''$ (FIG. 4) can be first positioned below a containment vessel 12" to draw magnetic particles downward (arrows ↓) relative to a surface 28" of a substrate 16" then moved to above the substrate 16" (e.g., magnetic field generator $14b''$) to draw magnetic particles upward (arrows ↑) relative to the substrate surface, then moved to one side of the containment vessel 12" (e.g., $14a''$) to draw magnetic particles in a lateral direction (arrows ←), and/or to a second position at another side of the containment vessel 12" (e.g., magnetic field generator $14a_2''$) to draw magnetic particles in a second lateral direction (arrow →), or other combination or sequence.

The magnetic particles will accumulate in response to the magnetic field. For example, in the embodiment depicted in FIGS. 2 and 2A, magnetic particles 22 and contaminant-conjugated magnetic particles 34 will accumulate at the side of the containment vessel 12 in proximity to the magnetic field generator 14. The accumulated magnetic particles 22 and contaminant-conjugated magnetic particles 34 can then be removed, for example, by terminating the magnetic field and discharging the liquid composition 20 from the containment vessel 12, for example, through a discharge outlet 38, as shown in FIG. 2.

In some embodiments, the composition 20 including the magnetic particles 22 and contaminant-conjugated magnetic particles 34 can be passed through the outlet 38 by gravity, optionally by applying force or a pressure differential (e.g., vacuum or suction). In other embodiments, as illustrated in FIG. 2, a magnetic field generator 40 can be positioned at the outlet to generate a magnetic field to attract and draw the magnetic particles 22 and contaminant-conjugated magnetic particles 34 toward and into the outlet 38. The apparatus 10 can further include a collection device 42 for receiving and collecting the magnetic particles 22 and contaminant-conjugated magnetic particles 34 of the discharged composition 20. The collection device 42 can be structured, for example, with a filter 43 that can be positioned within or proximal to the outlet 38 to isolate and collect the magnetic particles 22 and contaminant-conjugated magnetic particles 34, for example, a glass fiber filter, porous membrane, paper filter, woven fabric filter, etc. The magnetic particles 22 and contaminant-conjugated magnetic particles 34 can also be recovered from the discharged composition 20 by centrifugation or other known method.

In embodiments of the invention, a collected material can then be processed to separate and recover the magnetic particles 22 from contaminants 30, particulates and other components. In some embodiments, the magnetic particles 22 can be separated or cleaved off from the contaminants 30 by an optical, chemical or other suitable cleavage method. For example, the magnetic particles 22 can be separated from contaminants 30 by applying an appropriate elution buffer, applying a magnetic field to draw off the magnetic particles 22, and removing the supernatant containing the contaminants 30.

Figure 5:
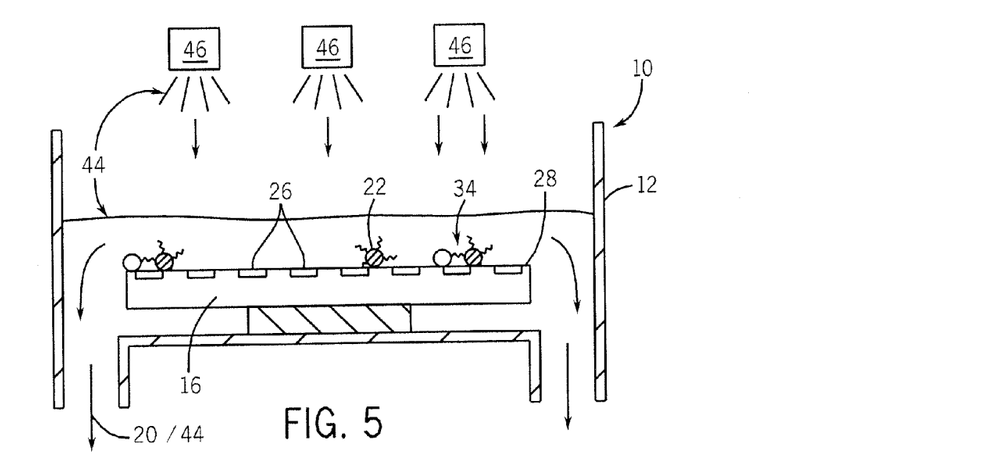
FIG. 5 is a cross-sectional view of the apparatus shown in FIG. 2 at a subsequent processing stage.

As illustrated in FIG. 5, a rinse water or other aqueous medium 44 can then be applied (arrows ↓↓) to remove the composition 20, including magnetic particles 22 and/or contaminant-conjugated magnetic particles 34, from the substrate 16. The aqueous medium 44 can be applied, for example, from a dispensing device 46 under non-damaging conditions by dispensing, by aerosol spraying, by megasonic rinsing, etc.

Figure 6:
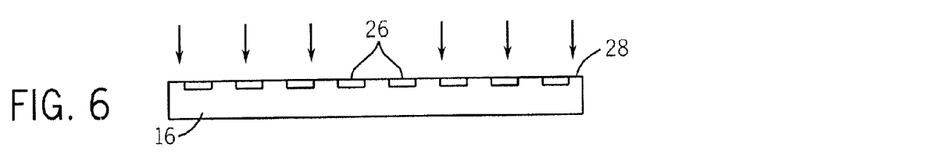
FIG. 6 is a cross-section view of the substrate shown in FIG. 5 at a subsequent processing stage.

Referring now to FIG. 6, a post-clean procedure (arrows ↓↓) can then be conducted to apply a cleaning agent to remove remaining residual material (e.g., remaining composition, magnetic particles, etc.) from the substrate 16 leaving a cleaned surface 28. For example, a post-clean can be conducted through the use of an SC1 clean or DHF clean (e.g., about 500:1 water:HF) in conjunction with a spray or megasonic system, followed by a water rinse. Subsequent processing of the substrate 16 and features 26 can then be conducted as desired.

Figure 7:
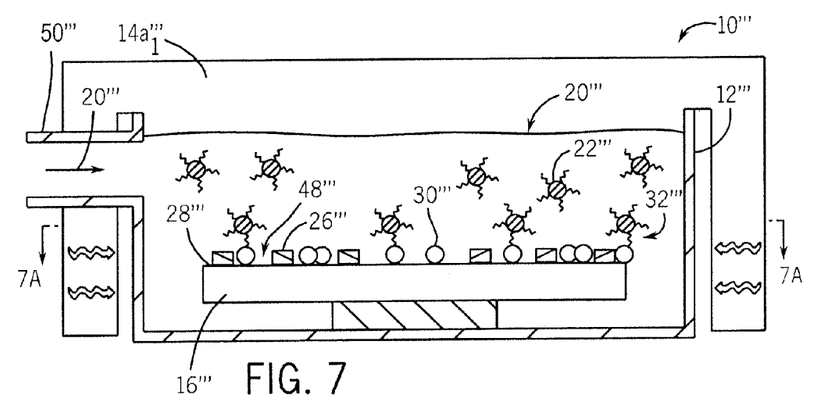
FIG. 7 is diagrammatic elevational cross-sectional view of an apparatus for removing contaminants from a substrate according to another embodiment of the invention.
Figure 7A:
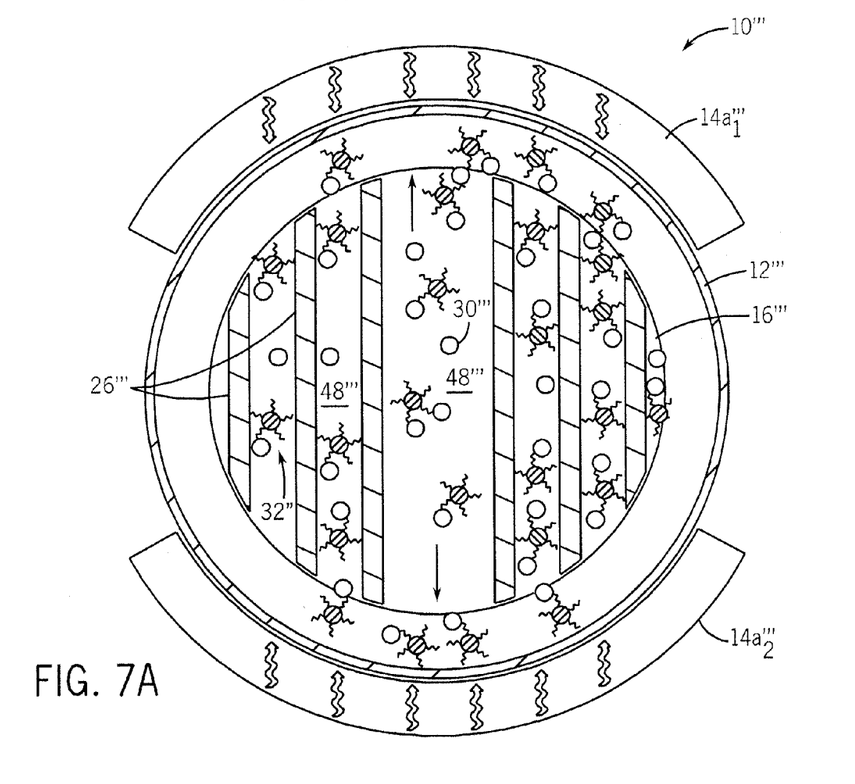
FIG. 7A is a top plan view of the apparatus of FIG. 7, taken along line 7A-7A.

In another embodiment of a method of the invention illustrated in FIGS. 7 and 7A, a composition 20''' according to the invention containing magnetic particles 22''' can be applied to remove contaminants 30''' from a substrate 16''' having a non-planar topography, for example, one or more structures 26''' that project or protrude from the surface 28'''. In some embodiments, the substrate 16''' can comprise a plurality of structures 26''' that protrude from the surface 28''' and extend over the substrate 16''' separated by a channel or recess 48'''. The structures 26''' can be, for example, a gate runner, wordline, bit line, conductive line (e.g., conductive metal trace line, interconnect, etc.), insulative line, spacer line, etc., of a material (e.g., conductive, semiconductive, insulative, etc.), such as oxides, nitrides, silicon materials, carbon materials, resists, metals, metal-containing materials, etc. The substrate 16''' can comprise a plurality of elements, for example, contacts, bond pads, ball pads, ball contacts, transistors, isolation structures (e.g., shallow trench isolation (STI) structures), etc., that project from the surface 28''' of the substrate 16''', and, in some embodiments, can be situated in generally parallel-aligned linear arrays.

Contaminants 30''' composed of conductive, insulative and/or semiconductive materials such as oxides, nitrides, silicon materials, carbon, polymer resist, metals and metal-containing materials, among others, can remain adhered to the structures 26''' and/or the surface 28''' of the substrate 16''' as a result of earlier processing. A composition 20''' can be applied to the substrate 16''' by delivery from a dispensing device or, as illustrated, by flowing into the containment vessel 12''' through an inlet, as shown in FIG. 7.

In some embodiments, contaminants 30''' can be removed from the non-planar surface 28''' of the substrate by applying a composition according to the invention and applying one or more magnetic fields to draw and remove the contaminant-conjugated magnetic particles 34''' using a low force in a lateral direction across the substrate (and/or in an upward or downward direction), as previously described with respect to FIGS. 1-4.

In another embodiment of the invention, magnetic field generators $14a_1'''$, $14a_2'''$ can be positioned on opposing sides as shown in FIG. 7A, or on one side of the substrate 16''', at or about a perpendicular orientation relative to the axis of line element structures 26'''. Upon the application of a magnetic field (arrows ⇒) from one or both magnetic field generators $14a_1'''$, $14a_2'''$, the magnetic particles 22''' and contaminant-conjugated magnetic particles 34''' can be drawn in a lateral direction (arrows ↕) within and along the channels 48''' and relatively parallel to the line element structures 26'''. This arrangement and application of magnetic field(s) from magnetic field generators $14a_1$% and/or $14a_2'''$ in a parallel direction relative to the axis of elevated structures 26''' (e.g., lines) on the surface 28''' of the substrate 16''' can reduce contact by the magnetic particles 22''' and contaminant-conjugated magnetic particles 34''' that can result in damage to the structures 26'''.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of this disclosure as described herein. It is therefore intended that such changes and modifications be covered by the appended claims and the equivalents thereof. The disclosures of patents, references and publications cited in the application are incorporated by reference herein.

What is claimed is:

1. A method for removing a contaminant from a surface of a substrate, comprising:
    applying a composition comprising magnetic particles onto a surface of a substrate, the magnetic particles comprising core particles and a magnetic material coating the core particles, the core particles each comprising at least one of a polymeric material, a ceramic material, a semiconductive material, and a combination thereof;
    reacting the magnetic particles with a contaminant on the surface of the substrate to form contaminant-conjugated magnetic particles; and
    applying a magnetic field to remove the contaminant-conjugated magnetic particles from the surface of the substrate, and wherein the magnetic particles comprise a surface functional reactive group configured to couple with the contaminant.

2. The method of claim 1, wherein applying a magnetic field to remove the contaminant-conjugated magnetic particles comprises drawing the contaminant-conjugated magnetic particles laterally across the substrate.

3. The method of claim 1, wherein applying a magnetic field to remove the contaminant-conjugated magnetic particles comprises drawing the contaminant-conjugated magnetic particles downwardly toward the substrate.

4. The method of claim 1, wherein applying a magnetic field to remove the contaminant-conjugated magnetic particles comprises drawing the contaminant-conjugated magnetic particles in an upward direction from the substrate.

5. The method of claim 1, wherein applying a magnetic field to remove the contaminant-conjugated magnetic particles comprises applying the magnetic field in a single direction relative to the substrate.

6. The method of claim 1, wherein applying a magnetic field to remove the contaminant-conjugated magnetic particles comprises applying the magnetic field in more than one direction relative to the substrate.

7. The method of claim 6, wherein applying a magnetic field to remove the contaminant-conjugated magnetic particles comprises applying the magnetic field in a first direction and then in a second direction.

8. The method of claim 1, wherein applying a magnetic field to remove the contaminant-conjugated magnetic particles comprises oscillating the magnetic field.

9. The method of claim 8, wherein oscillating the magnetic field comprises pulsing the magnetic field.

10. The method of claim 8, wherein oscillating the magnetic field comprises increasing and decreasing a strength of the magnetic field.

11. The method of claim 1, wherein applying a magnetic field to remove the contaminant-conjugated magnetic particles comprises applying a plurality of magnetic fields.

12. The method of claim 1, further comprising exposing the surface of the substrate to a cleaning agent prior to applying the composition.

13. The method of claim 1, further comprising removing the contaminant-conjugated magnetic particles from the substrate.

14. The method of claim 13, further comprising applying a cleaning agent to remove residual material from the substrate after removing the contaminant-conjugated magnetic particles.

15. The method of claim 1, wherein the composition further comprises an additive selected from the group consisting of a co-solvent, pH modifier, chelating agent, antioxidant, rheology modifier, polar solvent, surfactant, and dispersing agent.

16. The method of claim 1, wherein the composition further comprises a surfactant.

17. The method of claim 1, wherein the composition further comprises an agent to enhance reactivity of the surface functional reactive group on the magnetic particles.

18. The method of claim 1, wherein the core particles comprise a functional group configured to react with the contaminant.

19. The method of claim 1, wherein the magnetic particles further comprise a polymer on the magnetic material, the polymer comprising a surface functional group configured to react with the contaminant.

20. The method of claim 1, wherein the magnetic particles consist essentially of the core particles and the magnetic material coating the core particles.

21. The method of claim 1, wherein the surface of the substrate is non-planar.

22. The method of claim 1, further comprising generating the magnetic field from a magnetic field generator situated on opposing sides of a vessel containing the substrate and the composition.

23. The method of claim 1, further comprising generating the magnetic field from a plurality of magnetic field generators.

24. The method of claim 23, wherein the plurality of magnetic field generators at least partially surround a vessel containing the substrate and the composition.

25. The method of claim 23, wherein the plurality of magnetic field generators are situated at a plurality of positions surrounding a vessel containing the substrate and the composition.

26. The method of claim 1, further comprising generating the magnetic field from a magnetic field generator situated beneath a base of a vessel containing the substrate and the composition.

27. The method of claim 1, further comprising generating the magnetic field from a magnetic field generator positioned above a vessel containing the substrate and the composition.

28. The method of claim 1, further comprising generating the magnetic field while moving a magnetic field generator about a vessel containing the substrate and the composition.

29. The method of claim 1, wherein the substrate and the composition are in a containment vessel, and the method further comprises discharging a composition comprising the contaminant-conjugated magnetic particle through an outlet from the vessel.

30. The method of claim 29, further comprising applying a magnetic field proximal to the outlet of the vessel.

31. The method of claim 1, further comprising controlling the magnetic field through a computer program of a controller in communication with a magnetic field generator.

32. A method for removing contaminants from a surface of a substrate, comprising:
applying a composition comprising magnetic particles to a surface of a substrate, the magnetic particles comprising core particles, a magnetic material on the core particles, and surface functional groups configured to couple with contaminants;
coupling the magnetic particles with the contaminants to form contaminant-conjugated magnetic particles; and
applying a magnetic field to move the contaminant-conjugated magnetic particles and disengage the contaminants from the surface of the substrate.

33. A method for cleaning a surface of a substrate comprising contaminants thereon, the method comprising:
applying a composition comprising magnetic particles onto a surface of a substrate, the magnetic particles comprising a magnetic material in a polymer matrix, and a polymeric material overcoating the magnetic material in the polymer matrix, the polymeric material comprising surface functional groups configured to form contaminant-conjugated magnetic particles with the contaminants from the surface of the substrate; forming contaminant-conjugated magnetic particles with the contaminants from the surface of the substrate; and applying a magnetic field to remove the contaminant-conjugated magnetic particles from the surface of the substrate.

34. The method of claim 32, wherein the substrate comprises a plurality of protruding structures extending over the substrate with a recess therebetween.

35. The method of claim 34, wherein applying a magnetic field to remove the contaminant-conjugated magnetic particles comprises moving the contaminant-conjugated magnetic particles laterally in a single direction across the substrate and substantially parallel to the plurality of protruding structures.

36. The method of claim 34, wherein applying a magnetic field to remove the contaminant-conjugated magnetic particles comprises moving the contaminant-conjugated magnetic particles along the recess between the plurality of protruding structures.

37. The method of claim 32, further comprising moving the contaminant-conjugated magnetic particles in multiple directions.

38. A method for removing a contaminant from a surface of a substrate, comprising:
applying a composition comprising magnetic particles onto a surface of a substrate, the magnetic particles comprising core particles, a magnetic material on the core particles, and a polymeric material overcoating the magnetic material, the polymeric material comprising a functional group configured to covalently couple with a contaminant to form a covalently-coupled magnetic particles-contaminants material; and
applying a magnetic field to remove the covalently-coupled magnetic particles-contaminants material from the substrate.

* * * * *